(12) United States Patent
Sakaguchi et al.

(10) Patent No.: US 9,082,866 B2
(45) Date of Patent: Jul. 14, 2015

(54) SEMICONDUCTOR STORAGE DEVICE AND METHOD OF MANUFACTURING THE SAME

(71) Applicant: KABUSHIKI KAISHA TOSHIBA, Minato-ku (JP)

(72) Inventors: Takeshi Sakaguchi, Yokkaichi (JP); Hirokazu Sugiyama, Mie-gun (JP); Yoshihisa Fujii, Yokkaichi (JP); Shinichi Sotome, Yokkaichi (JP); Tadayoshi Watanabe, Tsukuba (JP); Koichi Matsuno, Mie-gun (JP); Naoki Kai, Kuwana (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/018,750

(22) Filed: Sep. 5, 2013

(65) Prior Publication Data
US 2014/0239368 A1     Aug. 28, 2014

(30) Foreign Application Priority Data

Feb. 22, 2013  (JP) ................. 2013-033236

(51) Int. Cl.
*H01L 29/788* (2006.01)
*H01L 21/762* (2006.01)
(Continued)

(52) U.S. Cl.
CPC ........ *H01L 29/788* (2013.01); *H01L 21/76224* (2013.01); *H01L 27/11524* (2013.01);
(Continued)

(58) Field of Classification Search
CPC ............. H01L 29/0649; H01L 21/76264; H01L 21/764; H01L 27/088; H01L 29/66825
USPC ................ 257/522, 316; 438/411, 266
See application file for complete search history.

(56) References Cited

U.S. PATENT DOCUMENTS

| 7,785,984 B2 | 8/2010 | Yamada et al. |
| 7,943,483 B2 | 5/2011 | Kobayashi et al. |

(Continued)

FOREIGN PATENT DOCUMENTS

| JP | 2007-335807 | 12/2007 |
| JP | 2008-103645 | 5/2008 |

(Continued)

OTHER PUBLICATIONS

Japanese Office Action mailed May 26, 2015, in Patent Application No. 2013-033236 with English translation.

*Primary Examiner* — Tu-Tu Ho
(74) *Attorney, Agent, or Firm* — Oblon, McClelland, Maier & Neustadt, L.L.P.

(57) ABSTRACT

A semiconductor device including a first isolation region dividing a semiconductor substrate into first regions; memory cells each including a tunnel insulating film, a charge storing layer, an interelectrode insulating film, and a control gate electrode above the first region; a second isolation region dividing the substrate into second regions in a peripheral circuit region; and a peripheral circuit transistor including a gate insulating film and a gate electrode above the second region. The first isolation region includes a first trench, a first element isolation insulating film filled in a bottom portion of the first trench, and a first gap formed between the first element isolation insulating film and the interelectrode insulating film. The second isolation region includes a second trench and a second element isolation insulating film filled in the second trench. The first and the second element isolation insulating films have different properties.

12 Claims, 22 Drawing Sheets

(51) Int. Cl.
  *H01L 29/66* (2006.01)
  *H01L 29/423* (2006.01)
  *H01L 27/115* (2006.01)
  *H01L 27/088* (2006.01)
  *H01L 21/8234* (2006.01)

(52) U.S. Cl.
  CPC .... *H01L27/11529* (2013.01); *H01L 29/42324* (2013.01); *H01L 29/66825* (2013.01); *H01L 29/7881* (2013.01); *H01L 21/823481* (2013.01); *H01L 27/088* (2013.01)

(56) References Cited

U.S. PATENT DOCUMENTS

| | | |
|---|---|---|
| 2006/0001073 A1 | 1/2006 | Chen et al. |
| 2006/0231884 A1 | 10/2006 | Yonemochi et al. |
| 2008/0182381 A1 | 7/2008 | Kiyotoshi |
| 2008/0283898 A1 | 11/2008 | Kuniya |
| 2010/0019311 A1 | 1/2010 | Sato et al. |
| 2012/0126306 A1* | 5/2012 | Kawaguchi et al. .......... 257/319 |
| 2012/0175725 A1 | 7/2012 | Takekida |
| 2012/0276713 A1 | 11/2012 | Miyahara et al. |
| 2013/0277730 A1* | 10/2013 | Jung et al. ................... 257/316 |

FOREIGN PATENT DOCUMENTS

| | | |
|---|---|---|
| JP | 2010-153621 | 7/2010 |
| JP | 2010-205822 | 9/2010 |
| JP | 2010-283256 | 12/2010 |
| JP | 2012-109464 | 6/2012 |
| JP | 2012-119442 | 6/2012 |
| JP | 2012-119443 | 6/2012 |
| JP | 2012-146693 | 8/2012 |
| JP | 2012-231007 | 11/2012 |

* cited by examiner

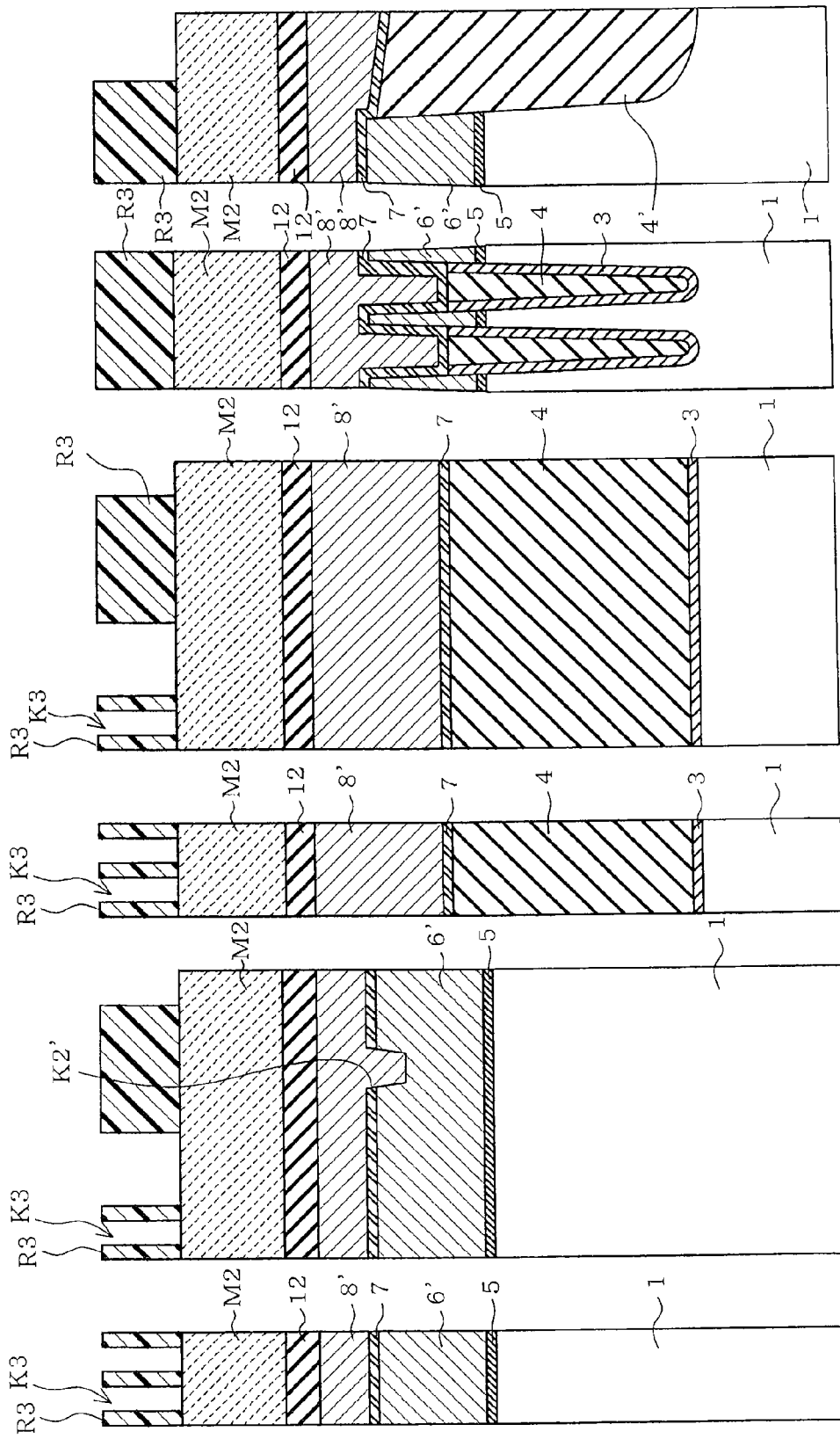

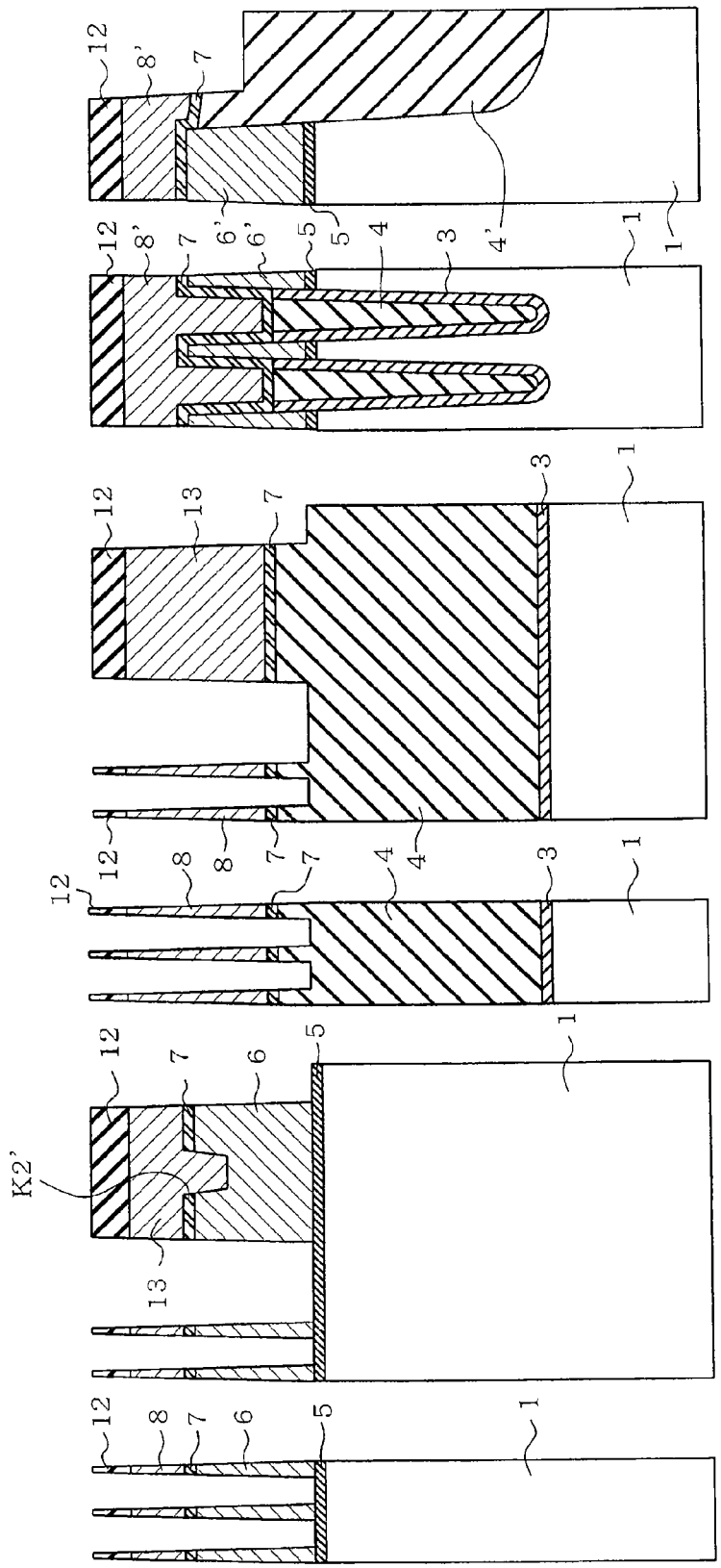

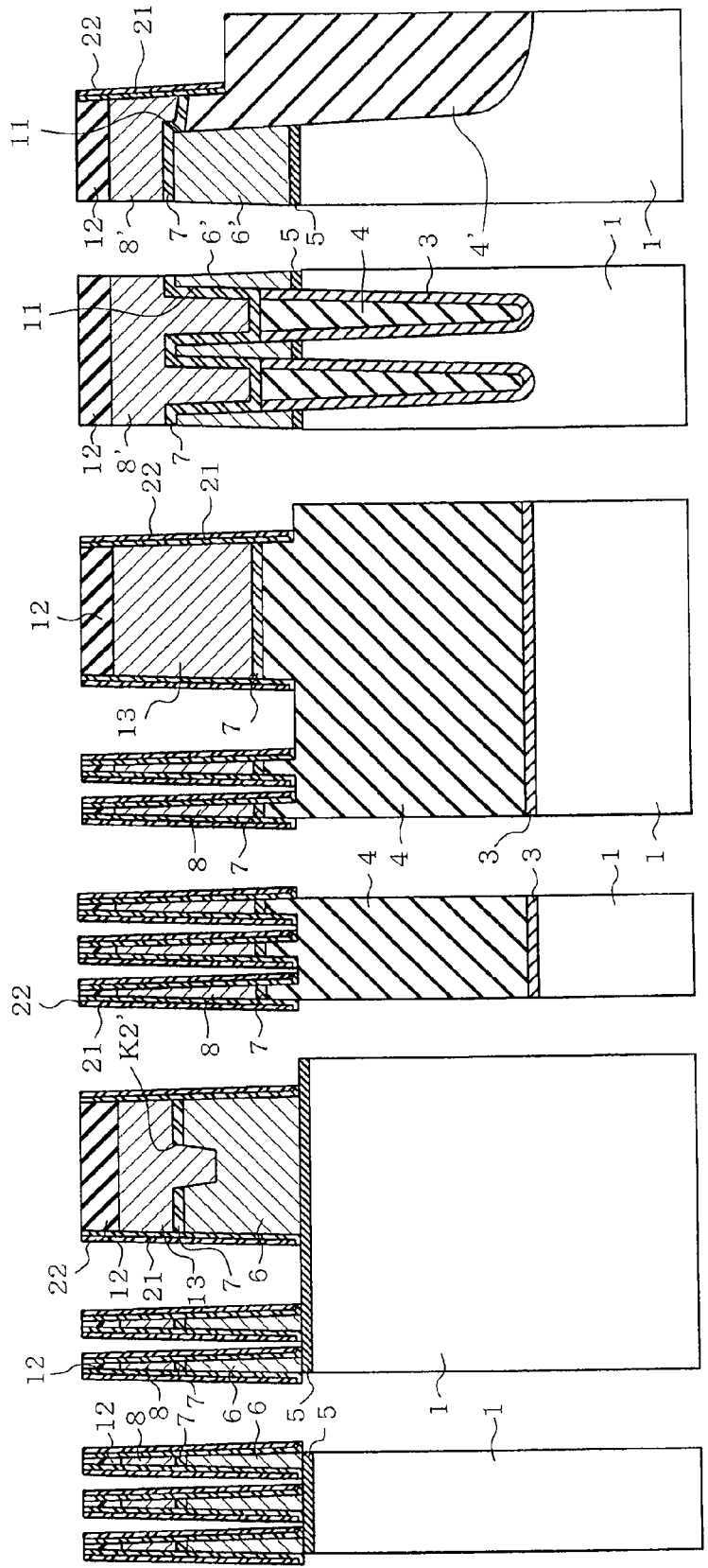

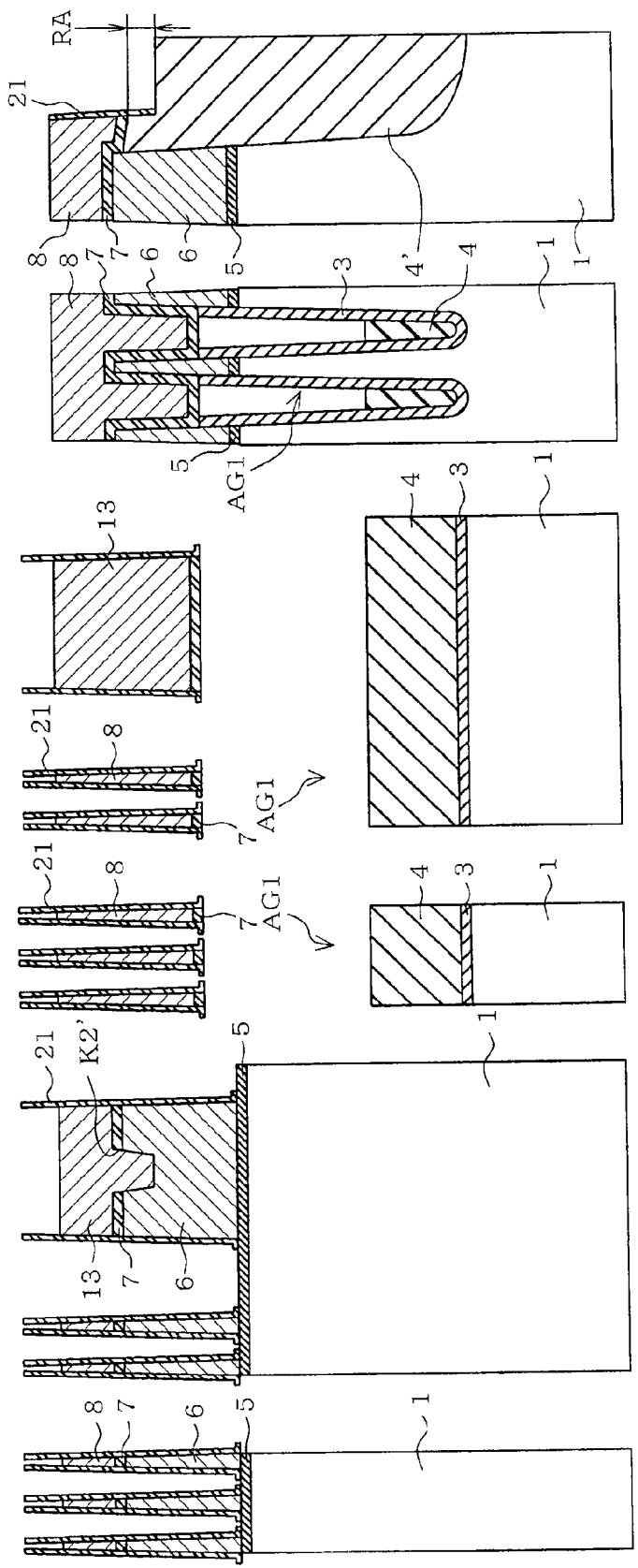

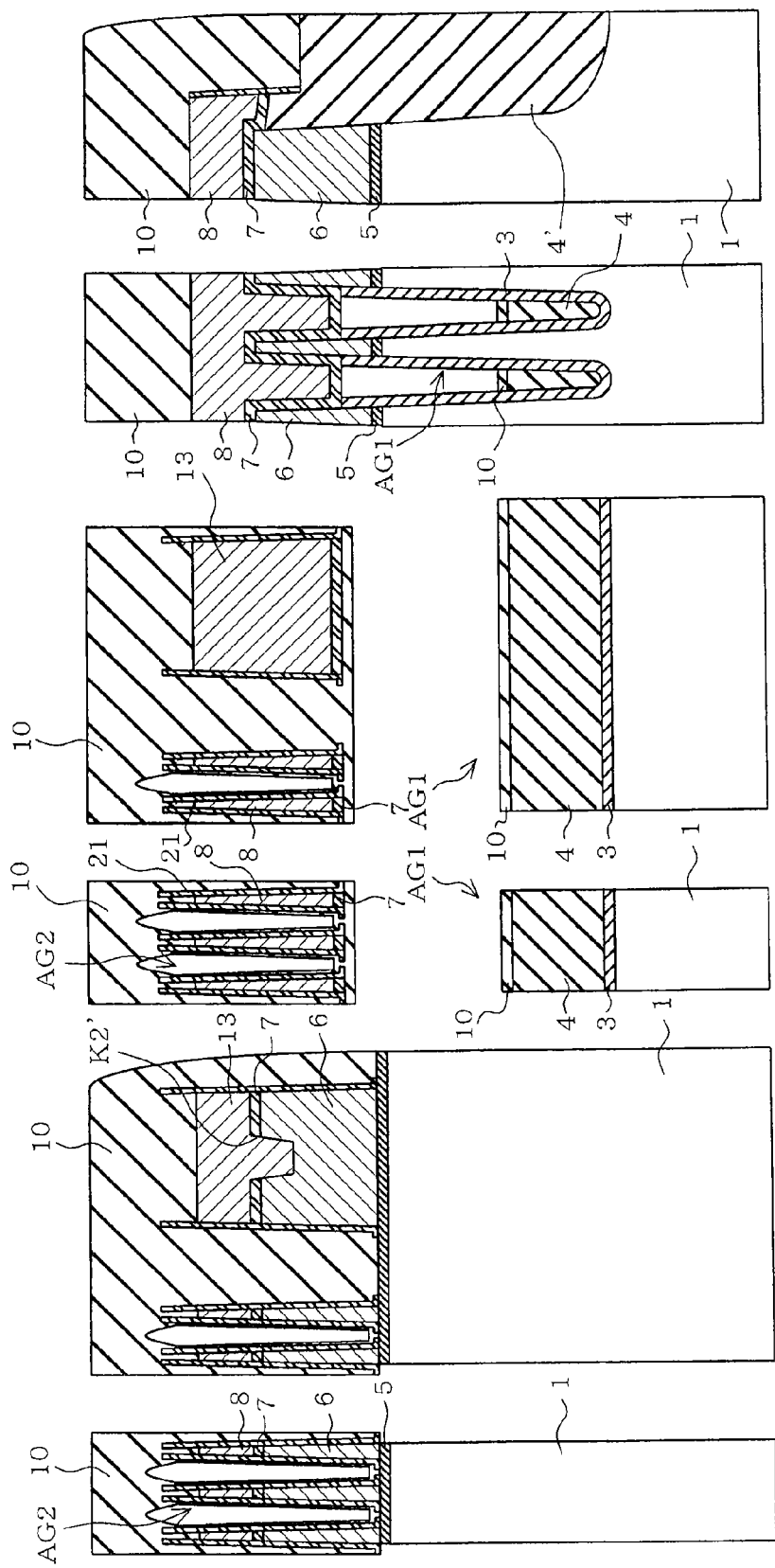

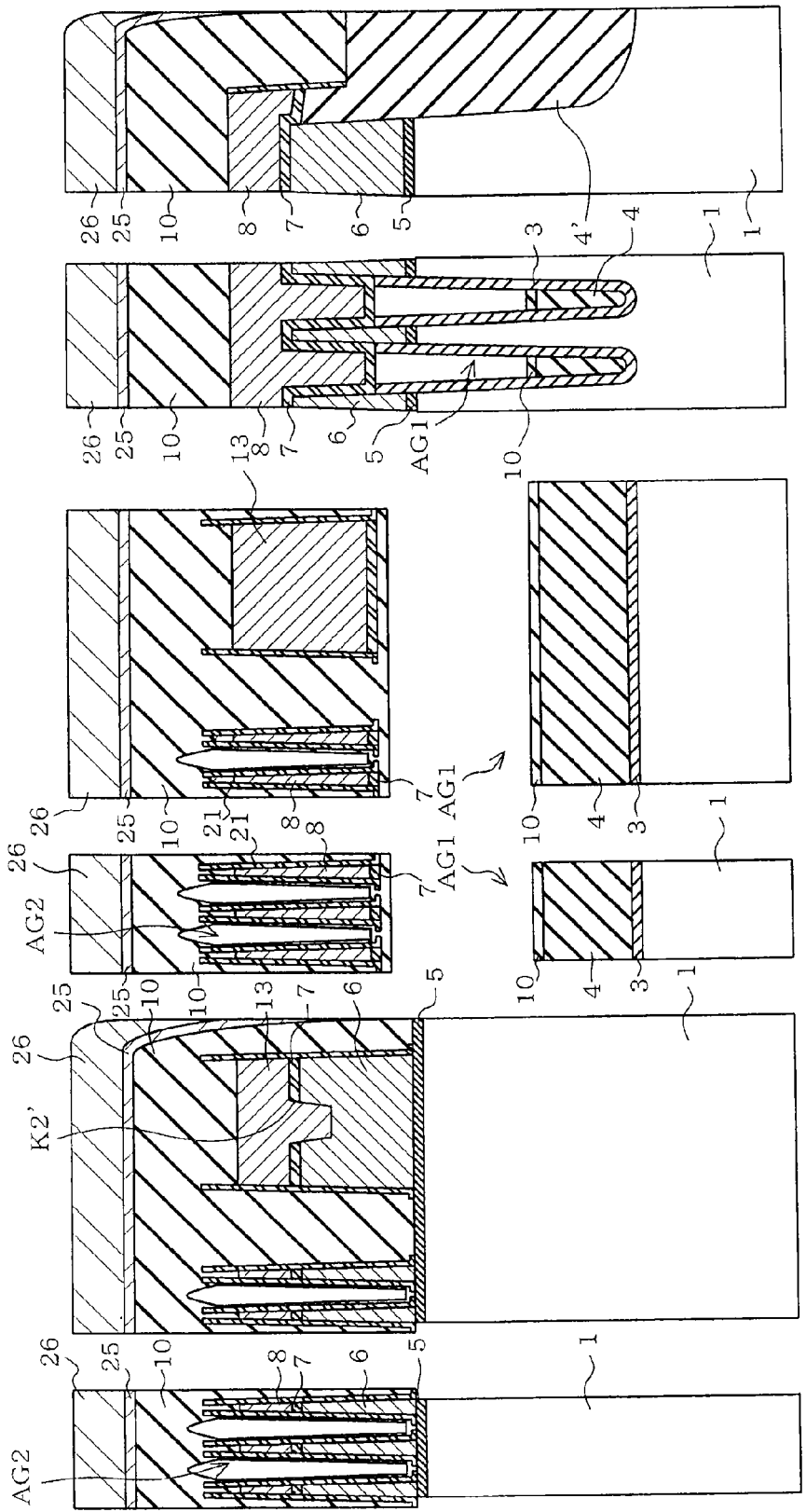

US 9,082,866 B2

SEMICONDUCTOR STORAGE DEVICE AND METHOD OF MANUFACTURING THE SAME

CROSS-REFERENCE TO RELATED APPLICATION(S)

This application is based upon and claims the benefit of priority from Japanese Patent Application No. 2013-033236, filed on, Feb. 22, 2013 the entire contents of which are incorporated herein by reference.

FIELD

Embodiments disclosed herein generally relate to a semiconductor device and a method of manufacturing the same.

BACKGROUND

In semiconductor devices such as a NAND flash memory device, memory cells are shrunk to achieve high integration. In case the memory cells are isolated by an element isolation region taking an STI (Shallow Trench Isolation) structure, the width of element isolation region becomes narrower with the shrinking of the memory cells. In contrast, the width of element isolation region between peripheral circuit transistors in the peripheral circuit region of a NAND flash memory device is significantly larger compared to the width of the element isolation region between the memory cells. Thus, in the element isolation region, the material of the element isolation film being filled into the element isolation trenches is preferably changed depending upon the dimensions such as the width or the depth of the element isolation trench, the shapes of nearby gate electrodes, and the voltage being applied to the elements, etc.

However, NAND flash memory devices have conventionally employed an approach in which the element isolation film was filled into the element isolation trenches between the memory cells and between the peripheral circuit transistors in the same process, meaning that element isolation insulating films made of the same material are filled into the respective trenches. As a result, local degradation in electrical properties was often observed. The degradation in electric properties originating from the material of the element isolation film may become even more prominent as the memory cells become even smaller.

BRIEF DESCRIPTION OF THE DRAWINGS

FIGS. 6A, 6B, 7A, 7B, 8A, 8B, 9A, 9B, 10A, 10B, 11A, 11B, 12A, 12B, 13A, 13B, 14A, 14B, 15A, 15B, 15C, 15D, 15E, 15F, 16A, 16B, 16C, 16D, 16E, 16F, 17A, 17B, 17C, 17D, 17E, 17F, 18A, 18B, 18C, 18D, 18E, 18F, 19A, 19B, 19C, 19D, 19E, 19F, 20A, 20B, 20C, 20D, 20E, 20F pertain to a second embodiment and are each an example of a cross sectional view schematically illustrating one phase of a manufacturing process flow of the nonvolatile semiconductor storage device.

DESCRIPTION

In one embodiment, a semiconductor device is disclosed. The device includes a semiconductor substrate; a first element isolation region dividing the semiconductor substrate into first element regions; memory cells each including a tunnel insulating film, a charge storing layer, an interelectrode insulating film, and a control gate electrode provided one over the other above the first element region; a second element isolation region dividing the semiconductor substrate into second element regions in a peripheral circuit region located in a periphery of a memory cell array in which the memory cells are disposed; and a peripheral circuit transistor including a gate insulating film and a gate electrode disposed one over the other above the second element region. The first element isolation region includes a first element isolation trench, a first element isolation insulating film filled in a bottom portion of the first element isolation trench, and a first gap formed between the first element isolation insulating film and the interelectrode insulating film. The second element isolation region includes a second element isolation trench and a second element isolation insulating film filled in the second element isolation trench. The first element isolation insulating film and the second element isolation insulating film have different film properties.

EMBODIMENTS

Embodiments are described hereinafter with references to the accompanying drawings. The elements that are substantially identical across the figures are represented by identical reference symbols and are not re-described. The drawings are not drawn to scale and thus, do not reflect the actual measurements of the features such as the correlation of thickness to planar dimensions and the relative thickness of different layers.

First Embodiment

Figure 1:
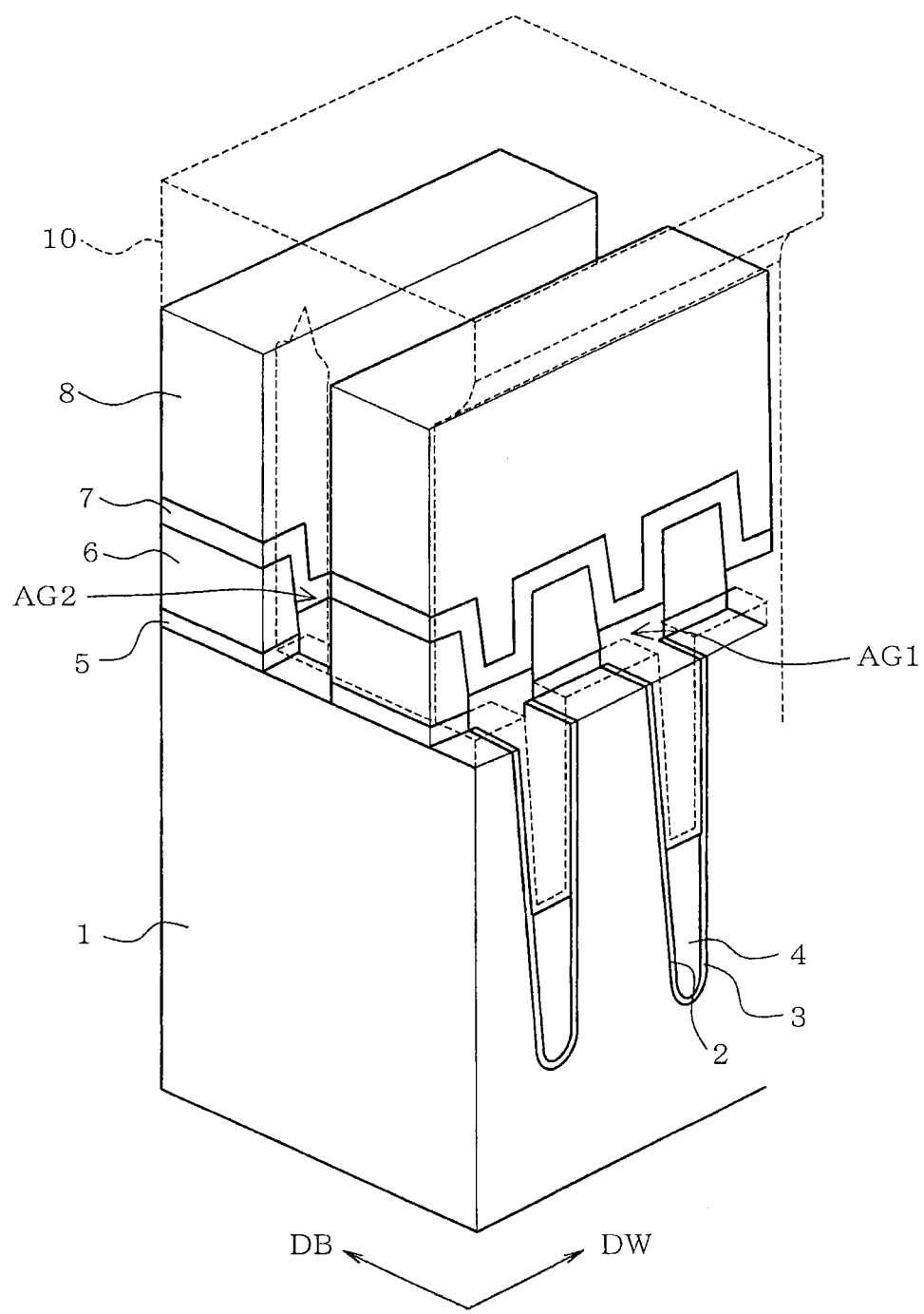
FIG. 1 is one example of a perspective view schematically illustrating a structure of a nonvolatile semiconductor storage device of a first embodiment.

FIG. 1 illustrates a first embodiment and is one schematic example of a perspective view of memory cells of a NAND flash memory device. As shown in FIG. 1, trenches 2, also referred to as first element isolation trenches, are formed into semiconductor substrate 1 along bit line direction DB to delineate semiconductor substrate 1 into a plurality of element regions also referred to as active regions. In the upper portion of the element regions of the memory cell, active regions such as a channel region and a source/drain region of a memory cell transistor provided in the memory cell are formed. The material of semiconductor substrate 1 may, for example, be selected from Si, Ge, SiGe, SiC, SiSn, PbS, GaAs, InP, GaP, GaN, GaInAsP, or ZnSe, etc.

Trench 2 is filled with element isolation insulating film 4, also referred to as a first element isolation insulating film, via sidewall insulating film 3. The wet etch rate of sidewall insulating film 3 is low (at least lower than the wet etch rate of element isolation insulating film 4), and the wet etch rate of element isolation insulating film 4 is high (at least higher than the wet etch rate of sidewall insulating film 3). Sidewall insulating film 3 may comprise a CVD (Chemical Vapor Deposition) oxide film or ALD (Atomic Layer Deposition) oxide film, or the like. Element isolation insulating film 4 may comprise a coating-type oxide film such as polysilazane coating film. The insulating film filled into trench 2 need not be double layered but may be single or triple layered. Sidewall insulating film 3, also referred to as a first insulating film, is recessed and element isolation insulating film 4, also referred to as second insulating film, is formed inside the recess.

A memory cell is provided with a tunnel insulating film, a charge storing layer, an interelectrode insulating film, and a control gate electrode. Above element region AA, floating gate electrode 6 is disposed via tunnel insulating film 5. Floating gate electrode 6 may serve as the charge storing layer. Tunnel insulating film 5 may comprise a thermal oxide film or a thermal oxynitride film. Alternatively, tunnel insulating film 5 may comprise a CVD oxide film or a CVD oxynitride film. Still alternatively, tunnel insulating film 5 may comprise a laminate of upper and lower insulating film with Si interposed therebetween or an insulating film containing dot embedded Si. Floating gate electrode 6 may comprise a polycrystalline silicon film doped with N-type or P-type impurities. Alternatively, floating gate electrode 6 may comprise a metal film comprising Mo, Ti, W, Al, or Ta; or a poly-metal film. Still alternatively, floating gate electrode 6 may comprise a nitride film.

Above floating gate electrode 6, control gate electrode 8 is formed in word line direction DW via interelectrode insulating film 7. Control gate electrode 8 may constitute a word line. Control gate electrode 8 may be formed so as to extend along the sidewalls of floating gate electrode 6 in order to improve the coupling ratio between floating gate electrode 6 and control gate electrode 8.

Above control gate electrode 8, cover insulating film 10 is formed. Interelectrode insulating film may comprise a silicon oxide film or a silicon nitride film. Alternatively, interelectrode insulating film may comprise a laminate of silicon oxide film and silicon nitride film such as an ONO film. Still alternatively, interelectrode insulating film may comprise a high dielectric constant film such as an aluminum oxide film or a hafnium oxide film, or a laminate of low dielectric constant film such as a silicon oxide film or a silicon nitride film and a high dielectric constant film.

Control gate electrode 8 may comprise a polycrystalline silicon film doped with N-type or P-type impurities. Alternatively, control gate electrode 8 may comprise a metal film comprising Mo, Ti, W, Al, or Ta; or a poly-metal film. Cover insulating film 10 may, for example, comprise a silicon oxide film.

Element isolation insulating film 4 filled into trench 2 is partially removed in order to form air gap AG1 or an unfilled gap between floating gate electrodes 6 adjacent to one another in word line direction DW. Air gap AG1 may be described as being formed between element isolation insulating film 4 and interelectrode insulating film 7 located below control gate electrode 8. Element isolation insulating film 4 and sidewall insulating film 3 may remain unremoved below interelectrode insulating film 7. The upper surface of element isolation insulating film 4 is lower than the upper surface of semiconductor substrate 1. Air gap AG1 may extend into trench 2 so as to reach an elevation lower than the under surface of floating gate electrode 6. Air gap AG1 may be formed to extend continuously inside trench 2 so as to run under control gate electrodes 8 of the adjacent memory cells.

Cover insulating film 10 extends across control gate electrodes 8 so as not to completely fill the gaps between floating gate electrodes 6. As a result, air gap AG2 is formed between floating gate electrodes 6 adjacent in the bit line direction DB. Air gap AG2 may be vertically asymmetrical. FIG. 1 shows an example in which the upper portion of air gap AG2 is pointed.

Sidewall insulating film 3 may comprise a material having an etch rate that differs from the etch rates of tunnel insulating film 5 and element isolation insulating film 4 in wet etching. For example, element isolation insulating film 4 may be etched by a first chemical liquid which etches sidewall insulating film 3 with a lower etch rate compared to element isolation insulating film 4. Sidewall insulating film 3 may extend upward from trenches 2 and cover the sidewall of tunnel insulating film 5 before element isolation insulating film 4 inside air gap AG1 is removed.

Sidewall insulating film 3 may comprise a dense silicon oxide film such as NSG (Non-doped Silicate Glass) film, TEOS (Tetraethyl orthosilicate) film, HTO (High Temperature Oxide) film, or modification of the foregoing films. Tunnel insulating film 5 and element isolation insulating film 4 may also comprise a silicon oxide film. First chemical liquid may comprise a dilute hydrofluoric acid.

Providing air gaps AG1 and AG2 between floating gate electrodes 6 achieves reduced parasitic capacitance between floating gate electrodes 6 as compared to when the gaps between floating gate electrodes 6 are filled, for example, with an insulating film such as a silicon oxide film since relative dielectric constant of air is approximately 1, whereas relative dielectric constant of a silicon oxide film is approximately 3.9. Thus, interference of electric field between the adjacent cells originating from the parasitic capacitance of the floating gate electrodes can be reduced. As a result, the range of threshold distribution of the memory cell transistor can be reduced.

Further, by allowing air gap AG1 to extend deeper than the under surface of floating gate electrode 6, in other words, by allowing air gap AG1 to exist in an elevation lower than the under surface of floating gate electrode 6, fringe capacitance between control gate electrode 8 and semiconductor substrate 1 can be reduced. As a result, the coupling ratio between floating gate electrode 6 and control gate electrode 8 can be improved and thereby reduce the programming voltage.

Further, by covering the sidewall of tunnel insulating film 5 with sidewall insulating film 3 when removing element isolation insulating film 4 inside air gap AG1, tunnel insulating film 5 can be protected even when the desired wet etch selectivity cannot be obtained between element isolation insulating film 4 and tunnel insulating film 5.

Figure 2:
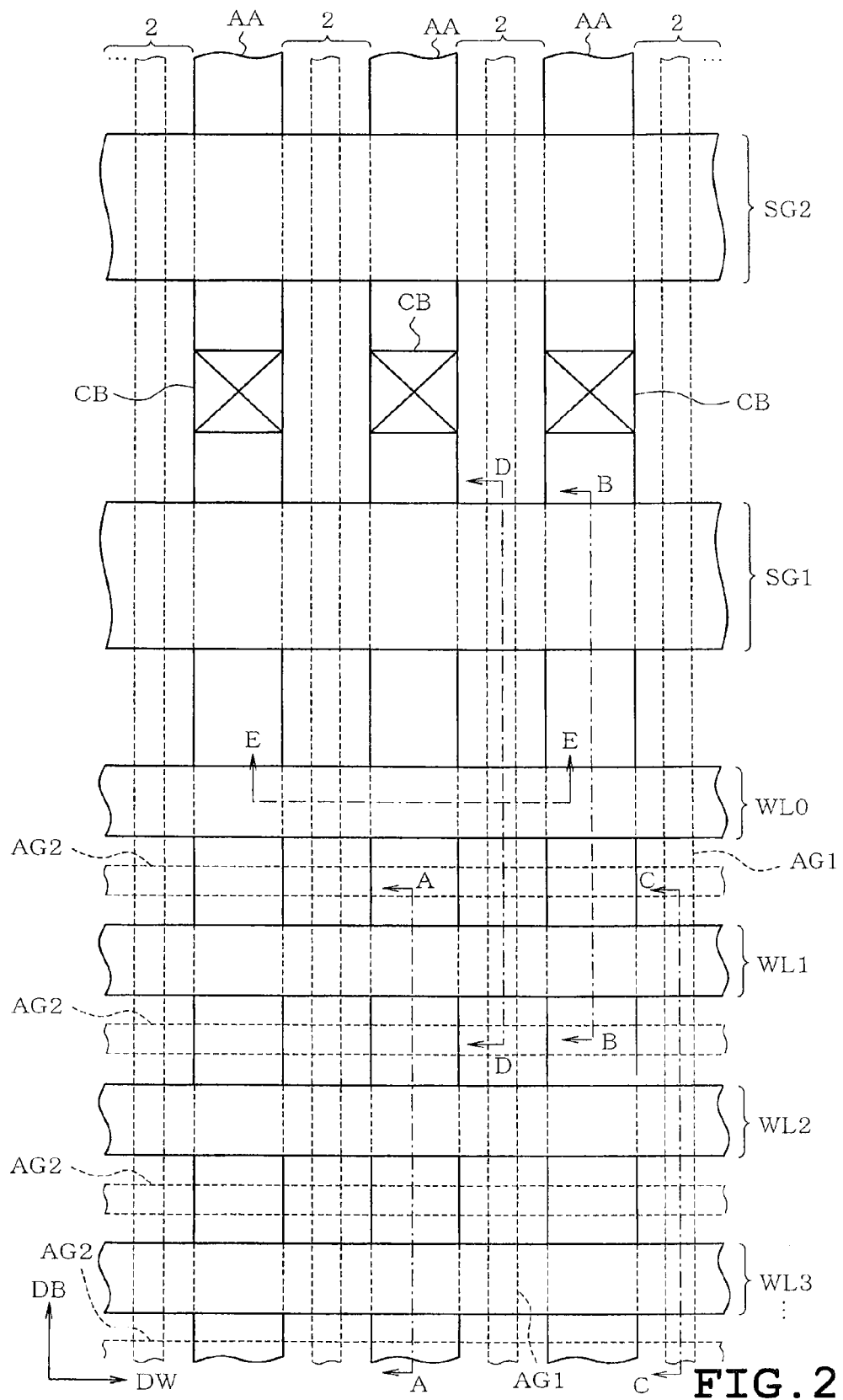
FIG. 2 is one example of a plan view schematically illustrating a structure of a memory cell array of the nonvolatile semiconductor storage device of the first embodiment.

FIG. 2 is one example of a plan view of the structure illustrated in FIG. 1.

In FIG. 2, trenches 2 are formed along bit line direction DB and element regions AA are isolated by trenches 2. Along bit line direction DB, word lines WL0, WL1, . . . extending in the word line direction are disposed at predetermined space interval, and select gate electrodes SG1 and SG2 are disposed on bit line direction DB sides of the group of word lines WL0, WL1, . . . as partially shown in FIG. 2. In each of element regions AA located between select gate electrodes SG1 and SG2, bit line contact CB is formed.

Air gaps AG1 extend in bit line direction DB along trenches 2. Air gaps AG2 extend in word line direction DW between word lines WL0, WL1, . . . .

Air gaps AG1 may be formed so as to run under word lines WL0, WL1, . . . of the adjacent memory cells and extend continuously along bit line direction DB inside trenches 2. Air gaps AG1 may be formed along trenches 2 so as to further run under select gate electrodes SG1 and SG2 and penetrate through the portions below select gate electrodes SG1 and SG2. Further, air gaps AG2 extend in word line direction DW so as to be located between word lines adjacent in bit line direction DB.

By providing air gap AG1 below select gate electrodes SG1 and SG2, the influence of fringe capacitance of select gate electrodes SG1 and SG2 on the channel region can be reduced. Thus, the channel can be controlled and driven more effectively by gate electric field.

Figure 3:
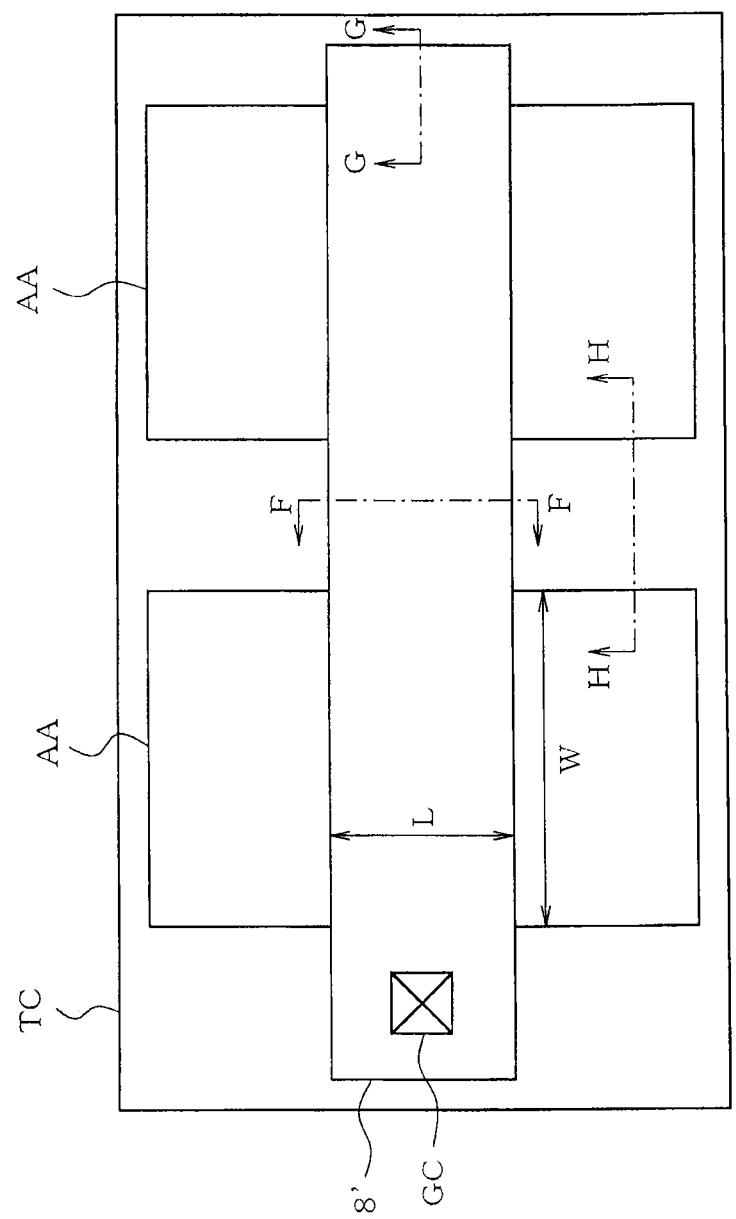
FIG. 3 is one example of a plan view schematically illustrating a structure of a peripheral circuit transistor of the nonvolatile semiconductor storage device of the first embodiment.
Figure 4A:
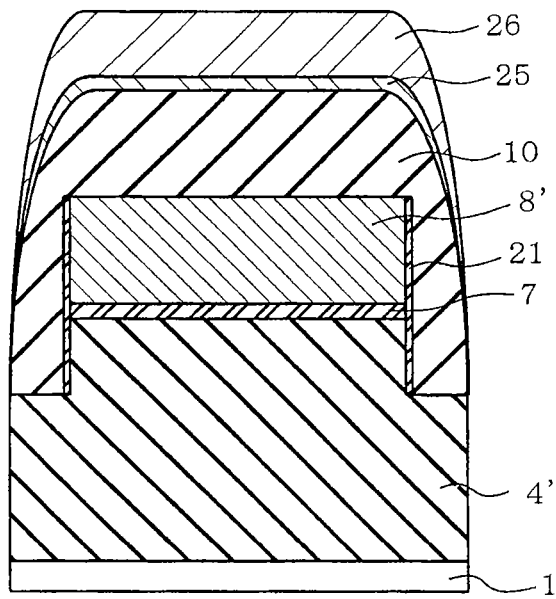
FIGS. 4A, 4B and 5 are examples of a cross sectional view schematically illustrating structures of the peripheral circuit transistor of the nonvolatile semiconductor storage device of the first embodiment.
Figure 4B:
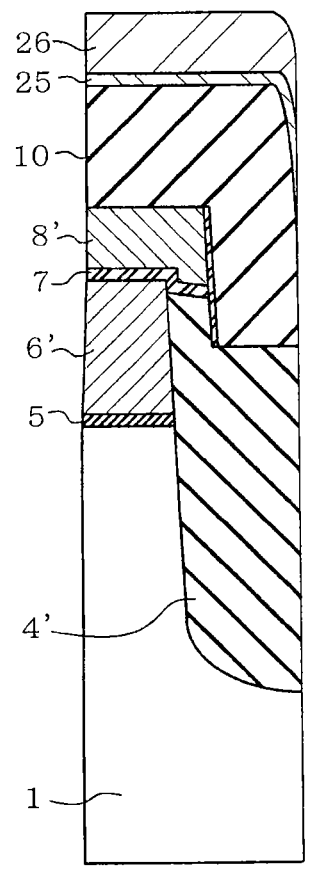
Figure 5:
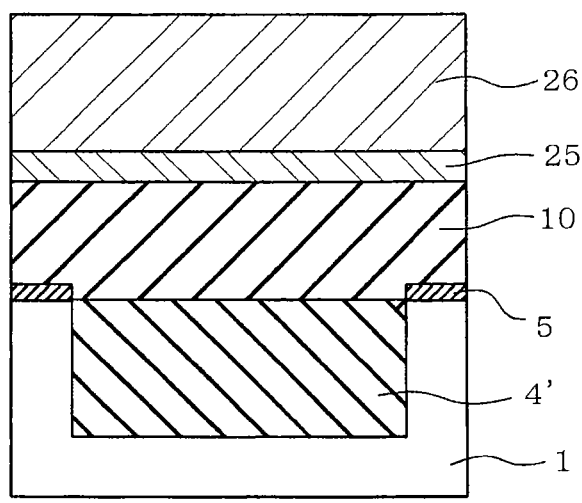

FIG. 3 also illustrates the first embodiment and is one schematic example of a plan view illustrating the structure of peripheral circuit transistors of the nonvolatile semiconductor storage device. FIGS. 4 and 5 also illustrates the first embodiment and are schematic examples of cross sectional views illustrating the structures of the nonvolatile semiconductor storage device. FIG. 4A is one example of a cross sectional view taken along line F-F of FIG. 3. FIG. 4B is one example of a cross sectional view taken along line G-G of FIG. 3. FIG. 5 is one example of a cross sectional view taken along line H-H of FIG. 3.

Referring to FIGS. 3, 4A and 4B, element region AA of the peripheral circuit region is delineated by trench TC. The peripheral circuit region may be disposed around the memory cell region. In the peripheral circuit region, element isolation regions are formed that delineate the semiconductor substrate into element regions.

A peripheral circuit transistor is formed by stacking tunnel insulating film 5 also referred to as gate insulating film, lower gate electrode 6', and upper gate electrode 8'. Lower gate electrode 6' and upper gate electrode 8' taken together are also referred to as a gate electrode. Upper electrode 8' may be disposed so as to extend over trench TC and gate contact GC may be formed in the extended portion of upper electrode 8'. The peripheral circuit region may be provided around the memory cell array shown in FIG. 2.

Below upper gate electrode 8', lower gate electrode 6' is disposed via interelectrode insulating film 7. Below lower gate electrode 6', tunnel insulating film 5 is disposed. Upper gate electrode 8' may be electrically connected to lower gate electrode 6' through an opening not shown formed in interelectrode insulating film 7. Along the sidewall of upper gate electrode 8', sidewall buffer film 21 is formed. Above upper gate electrode 8', TEOS film 10, SiN film 25, and interlayer insulating film 26 are disposed one over the other. Interlayer insulating film 26 may comprise a $SiO_2$ film. These films may be formed as in the memory cell region.

Lower gate electrode 6' may be made of the same material as floating gate electrode 6 and upper gate electrode 8' may be made of the same material as control gate electrode 8.

In the element isolation region of the peripheral circuit region, trench TC, also referred to as a second element isolation trench, is formed which is filled with an element isolation insulating film 4' also referred to as a second element isolation insulating film. Inside trench TC, element isolation insulating film 4' (second element isolation insulating film) is filled to an elevation substantially level with the upper surface of floating gate electrode 6 (lower gate electrode 6'). In other words, the upper surface of element isolation insulating film 4' is higher than the under surface of lower gate electrode 6'. The upper surface of element isolation insulating film 4' contacts the under surface of interelectrode insulating film 7, which means that there is no air gap between element isolation insulating film 4' and interelectrode insulating film 7. The gate length of upper gate electrode 8' may be represented by L and the gate width may be represented by W.

Unlike the memory cell region, element isolation trench TC is filled with a single layer of element isolation insulating film 4'. Element isolation insulating film 4' may comprise a material having a wet etch rate that differs from the wet etch rate of element isolation insulating film 4. Element isolation insulating film 4' is wet etched by the first chemical liquid at a lower etch rate as compared to the etch rate of element isolation insulating film 4.

Further, as shown in FIG. 5, TEOS film 10, SiN film 25, and interlayer insulating film 26 are disposed one over the other above element isolation insulating film 4' and tunnel insulating film 5. Interlayer insulating film 26 may comprise a $SiO_2$ film.

In the first embodiment described above, air gap AG1 is formed in the element isolation insulating film located in the memory cell region but no air gap is formed in element isolation insulating film 4' located in the peripheral circuit region. The upper surface of element isolation insulating film 4' is higher than the under surface of the charge storing layer. The upper surface of element isolation insulating film 4' may, for example, be substantially level with the upper surface of the charge storing layer. Such structure improves the planarity of element isolation insulating film 4' located in the peripheral circuit region.

The dimension of the opening formed in element isolation insulating film 4' located in the peripheral circuit region is greater than the dimension of the opening formed in element isolation insulating film 4 located in the memory cell region. Thus, when an air gap is formed in element isolation insulating film 4' located in the peripheral circuit region, a recess is formed in element isolation insulating film 4' and thereby loses its planarity. As a result, disconnects may occur when forming the upper interconnect layers in the peripheral circuit region.

In the first embodiment, an air gap is not formed in element isolation insulating film 4' located in the peripheral circuit region. Thus, disconnects of upper interconnect layers in the peripheral circuit region are prevented while suppressing the interference between the memory cells.

Further, degradation of electrical properties originating from the material of element isolation insulating films 4 and 4' can be prevented. For example, stress becomes a problem when polysilazane is used in forming the element isolation insulating film. However, in the first embodiment, a portion of element isolation insulating film 4 is removed in the memory cell region in order to form air gap AG1. As a result, stress can be reduced. In the peripheral circuit region on the other hand, air gap is not formed to maintain planarity. However, stress can be reduced by using materials that differ from the material of element isolation insulating film 4', one example of which may be a silicon oxide film such as TEOS or HTO. As a result, break down of elements in the peripheral circuit region can be prevented while preventing the memory cells from interfering with one another.

Second Embodiment

FIGS. 6A to 20D pertain to a second embodiment and are each an example of a cross sectional view for explaining the process flow for manufacturing a NAND flash memory device. FIGS. 6A to 14A and FIGS. 15E to 20E are cross sectional views taken along line E-E of FIG. 2. FIGS. 6B to 14B and FIGS. 15F to 20F are cross sectional views taken along line G-G of FIG. 3. FIGS. 15A to 20A are cross sectional views taken along line A-A of FIG. 2. FIGS. 15B to 20B are cross sectional views taken along line B-B of FIG. 2. FIGS. 15C to 20C are cross sectional views taken along line C-C of FIG. 2. FIGS. 15D to 20D are cross sectional views taken along line D-D of FIG. 2.

Figure 6A:
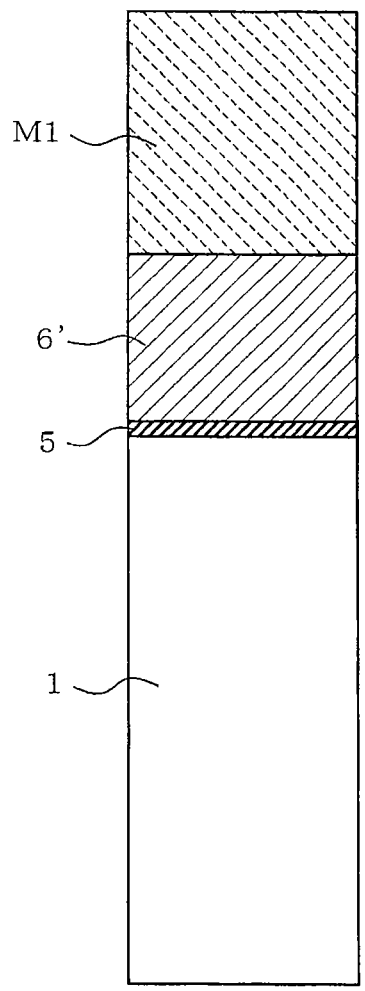
Figure 6B:
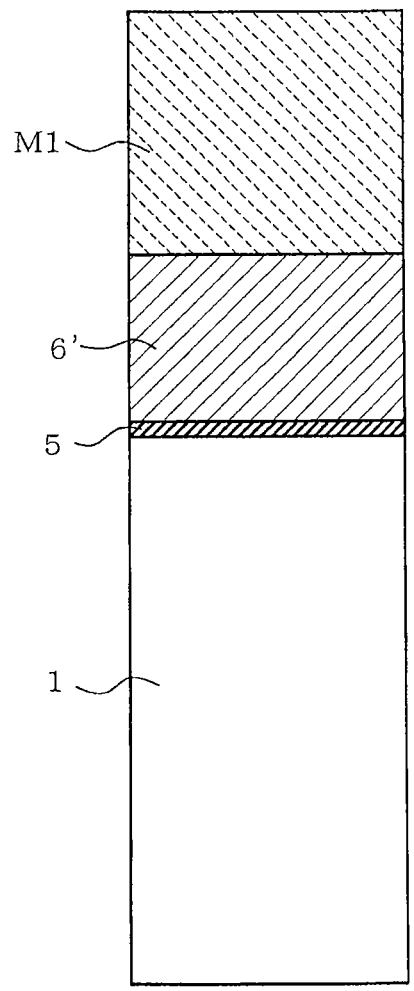

Referring to FIGS. 6A and 6B, tunnel insulating film 5 is formed above semiconductor substrate 1 by thermal oxidation, or the like. Then, floating gate electrode material 6' is formed above tunnel insulating film 5 by CVD, or the like, whereafter hard mask M1 is formed above floating gate electrode material 6'. Hard mask M1 may comprise a silicon oxide film, an amorphous silicon film, a silicon nitride film, or an organic film containing carbon.

Next, formation of an element isolation region (trench 2, element isolation insulating film 4) located between the memory cells of the memory cell region, and formation of an element isolation region (trench 2', element isolation insulating film 4') located between the peripheral circuit transistors of the peripheral circuit region are carried out. The formation of the element isolation region of the memory cell region precedes the formation of element isolation region of the peripheral circuit region.

Figure 7A:
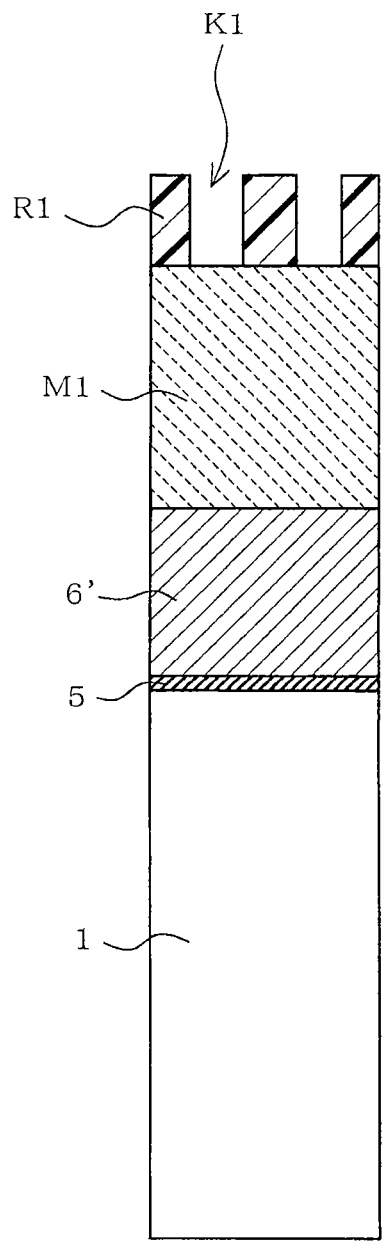
Figure 7B:
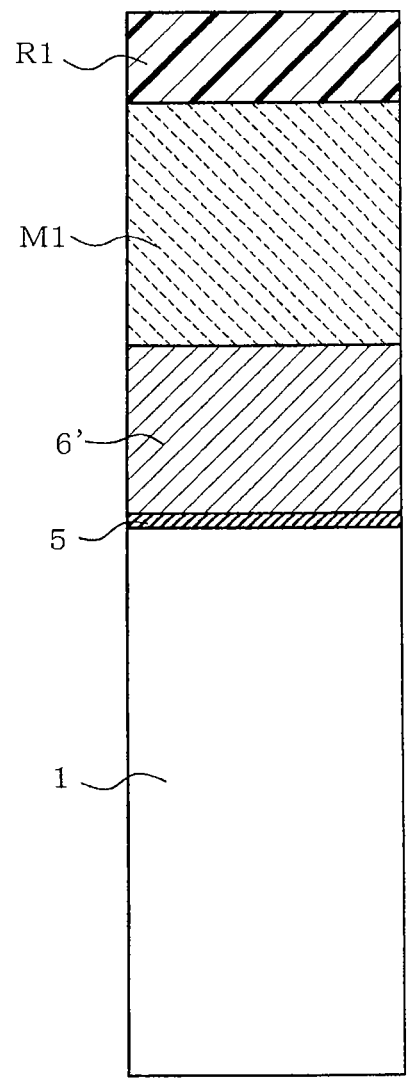

More specifically, resist pattern R1 having opening K1 in the memory cell region is formed above hard mask M1 by photolithography as shown in FIGS. 7A and 7B. Note that resist pattern R1 does not have opening K1 in the peripheral circuit region.

Figure 8A:
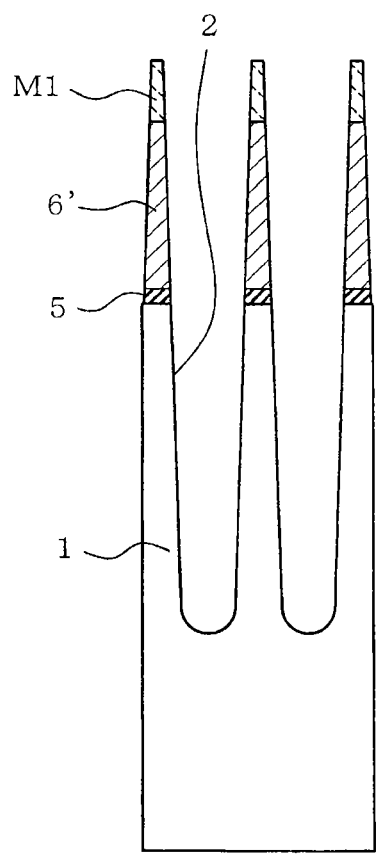
Figure 8B:
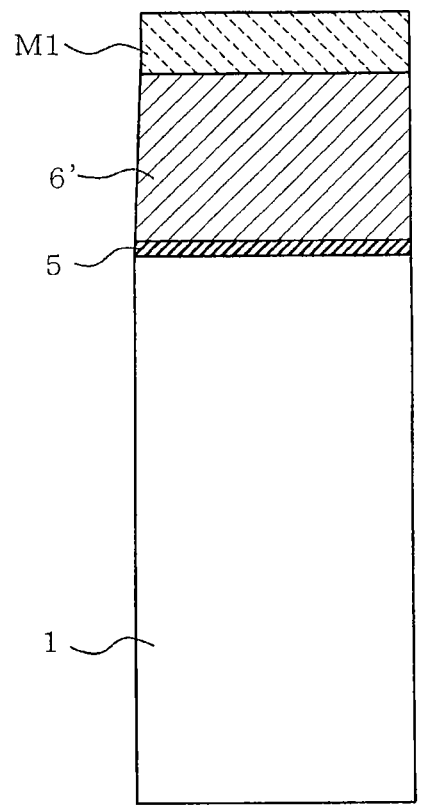

Then, as shown in FIGS. 8A and 8B, hard mask M1 is patterned using resist pattern R1 as a mask, whereafter hard mask M1 is used as a mask in etching floating gate electrode material 6', tunnel insulating film 5, and semiconductor substrate 1 to form trench 2, also referred to as the first element isolation trench, in the memory cell region of semiconductor substrate 1.

Figure 9A:
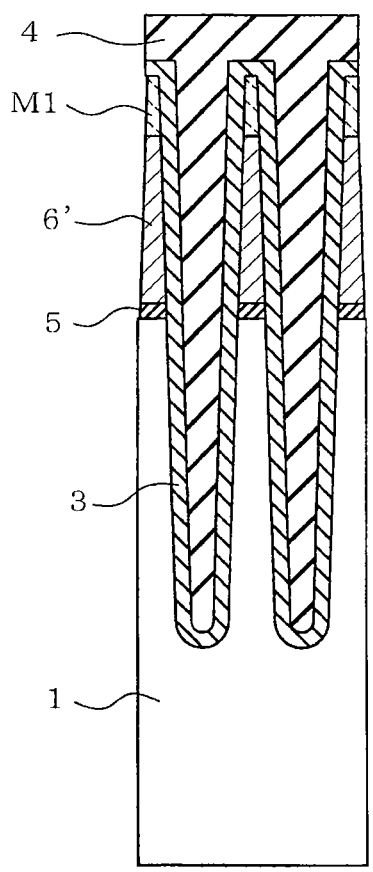
Figure 9B:
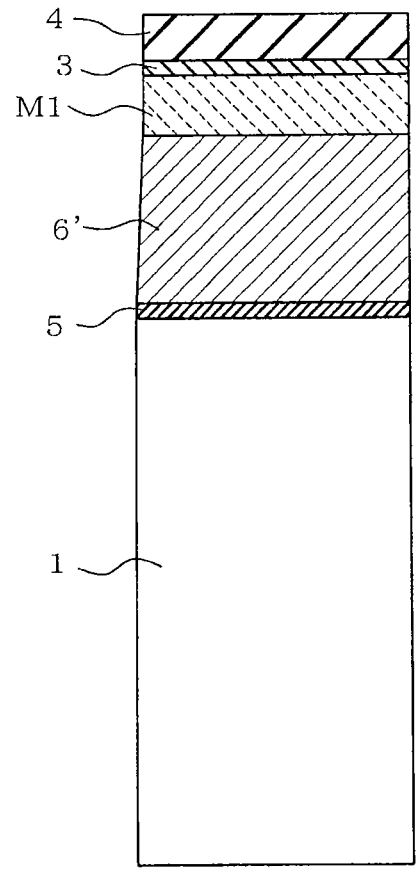

Then, as shown in FIGS. 9A and 9B, sidewall insulating film 3 is formed above hard mask M1 by methods such as CVD so that the sidewalls of trench 2 and the sidewalls of floating gate electrode material 6' are covered. Thereafter, by using methods such as coating, element isolation insulating film 4 is formed over sidewall insulating film 3 so as to completely fill trench 2. In this example, element isolation insulating film 4 comprises a coating-type oxide film, more specifically, a polysilazane oxide film. Sidewall insulating film 3 and element isolation insulating film 4 constitute the first element isolation insulating film.

Figure 10A:
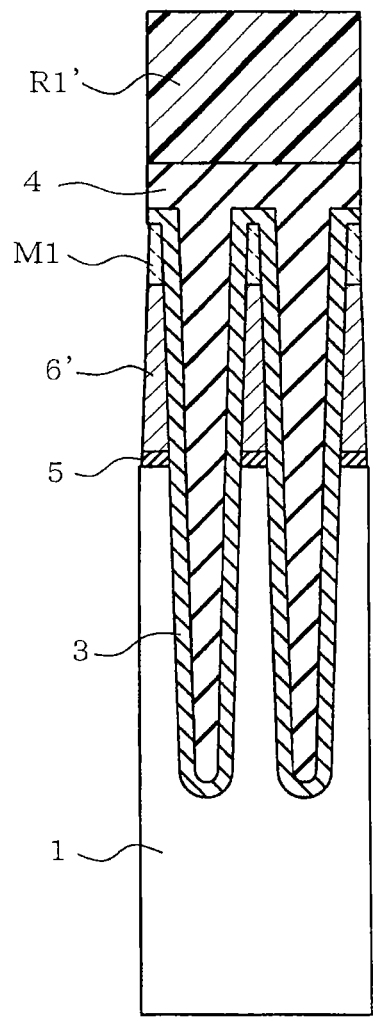
Figure 10B:
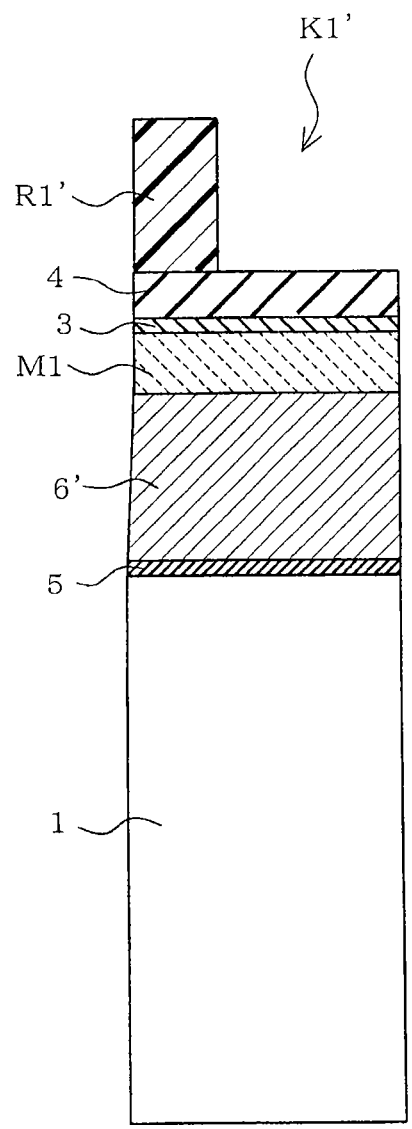

Next, as shown in FIGS. 10A and 10B, resist pattern R1' having opening K1' in the peripheral circuit region is formed above element isolation insulating film 4 by photolithography. Note that resist pattern R1' does not have an opening in the memory cell region.

Figure 11A:
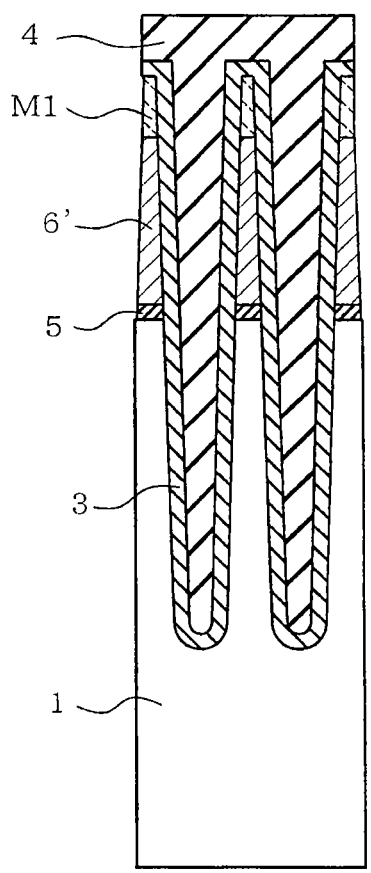
Figure 11B:
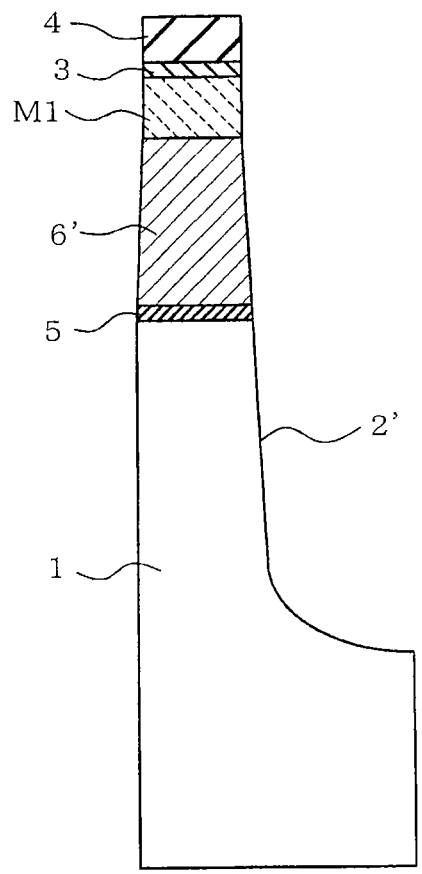

Then, as shown in FIGS. 11A and 11B, element isolation insulating film 4 is patterned using resist pattern R1' as a mask, whereafter the patterned element isolation insulating film 4 is used as a mask in etching hard mask M1, floating gate electrode material 6', tunnel insulating film 5, and semiconductor substrate 1 to form trench 2', also referred to as the second element isolation trench, in the peripheral circuit region of semiconductor substrate 1.

Figure 12A:
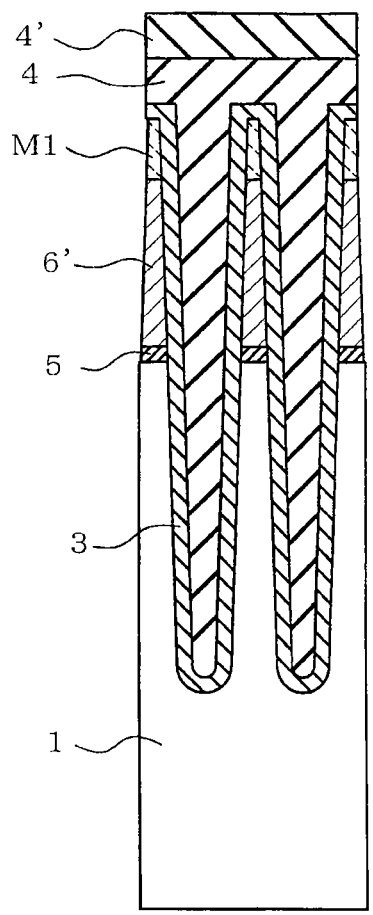
Figure 12B:
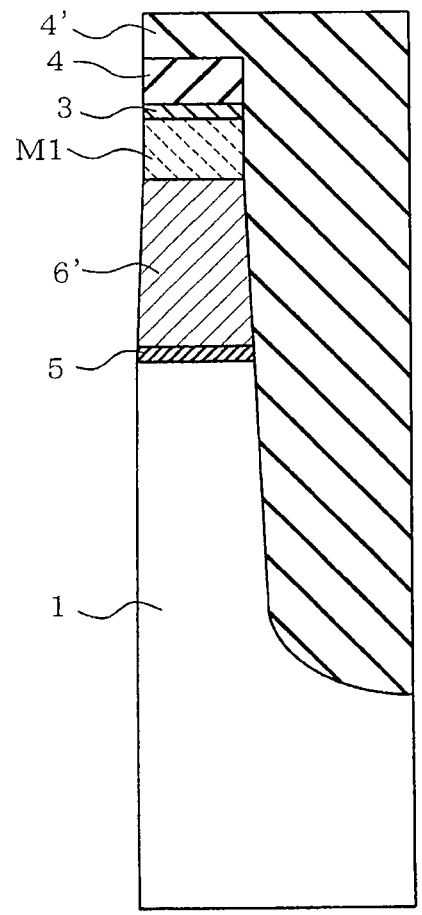

Then, as shown in FIGS. 12A and 12B, element isolation film 4' is formed above element isolation film 4 by methods such as CVD so as to completely fill trench 2'. In this example, element isolation insulating film 4' comprises a CVD oxide film such as NSG (non-doped silicate glass) film, TEOS (tetraethyl orthosilicate) film or HTO (High Temperature Oxide) film. Element isolation insulating film 4' comprises a material having a wet etch rate that differs from the wet etch rate of the material of element isolation insulating film 4. In this example, the wet etch rate of the element isolation insulating film 4' is lower than the wet etch rate of the material of element isolation insulating film 4.

Figure 13A:
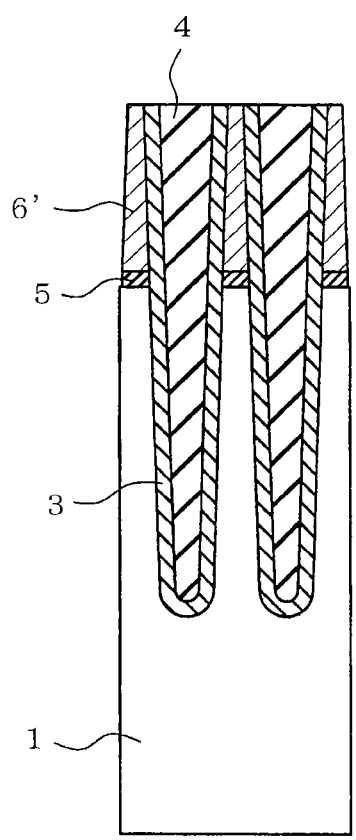
Figure 13B:
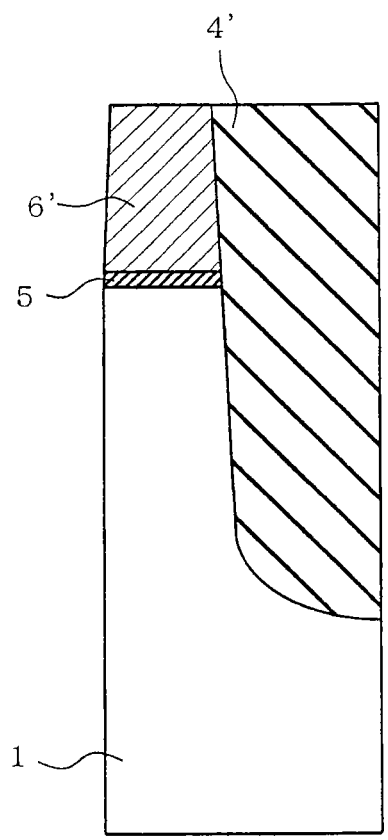

Thereafter, as shown in FIGS. 13A and 13B element isolation insulating films 4 and 4', hard mask M1, and sidewall insulating film 3 are planarized by methods such as CMP (Chemical Mechanical Polishing) to expose the surface of floating gate electrode material 6'.

Figure 14A:
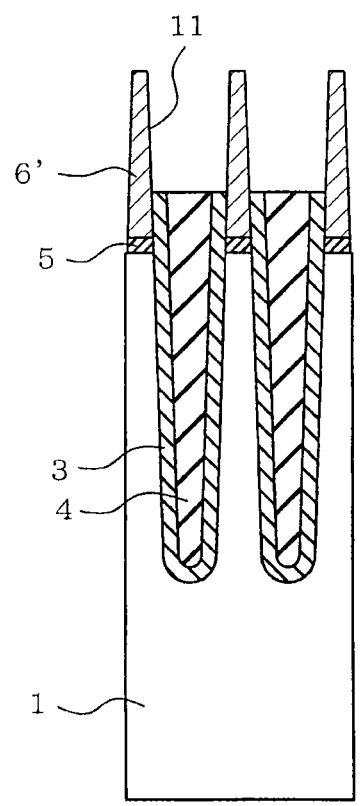
Figure 14B:
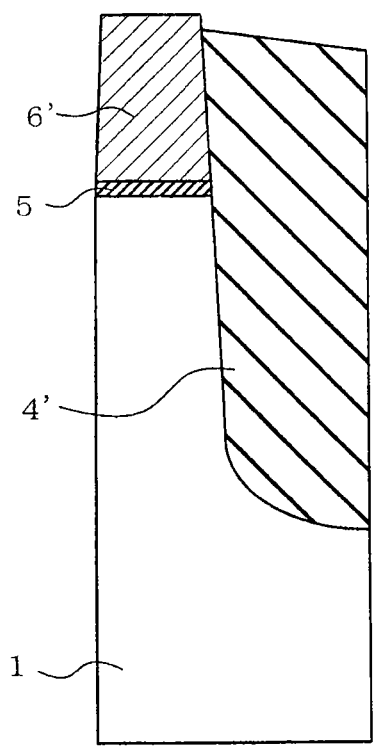

Next, as shown in FIGS. 14A and 14B, portions of sidewall insulating film 3 and element isolation insulating films 4 and 4' are removed by anisotropic etching such as RIE (Reactive Ion Etching) to form recess 11 that exposes a portion of the sidewalls of floating gate electrode material 6'. In forming recess 11, sidewall insulating film 3 and element isolation insulating film 4 and 4' preferably remain above tunnel insulating film 5. The upper surface of element isolation insulating film 4' in the peripheral circuit region is substantially level or slightly lower than the upper surface of floating gate electrode material 6'. The upper surface of element isolation insulating film 4, on the other hand, is lower than the upper surface of element isolation insulating film 4'. This results from the difference in the etch rates of element isolation insulating films 4 and 4' originating from the difference of their materials. The peripheral circuit region may be covered by a resist, or the like so that only element isolation insulating film 4 of the memory cell region is etched.

Next, as shown in FIGS. 15A to 15F, interelectrode insulating film 7 is formed using methods such as CVD so that the sidewalls and the upper surface of floating gate electrode material 6' are uncovered by element isolation insulating films 4 and 4'. Then, control gate electrode material 8' is formed above interelectrode insulating film 7 using methods such as CVD so as to fill recess 11.

Next, cap insulating film 12 and hard mask M2 are formed above control gate electrode material 8' in the listed sequence using methods such as CVD. Cap insulating film 12 and hard mask M2 may comprise materials such as a silicon oxide film or a silicon nitride film. Then, resist pattern R3 having opening K3 is formed above hard mask M2 by photolithography.

Next, as shown in FIGS. 16A to 16F, hard mask M2 is patterned using resist pattern R3 as a mask, whereafter cap insulating film 12, control gate electrode material 8', interelectrode insulating film 7, and floating gate electrode material 6' are etched using the patterned hard mask M2 as a mask. As a result, an isolated floating gate electrode 6 is formed in each memory cell, as well as control gate electrode 8 and select gate electrode 13 disposed above floating gate electrode 6 via interelectrode insulating film 7 that extend in word line direction DW. Select gate electrode 13 is connected to the underlying floating gate electrode 6 through opening K2'.

Then, as shown in FIGS. 17A to 17F, sidewall buffer film 21 and sidewall protection film 22 are formed along cap insulating film 12 by methods such as CVD so as to cover the sidewalls of interelectrode insulating film 7. Thereafter, sidewall buffer film 21 and sidewall protection film 22 are etched by anisotropic etching such as RIE to expose the surfaces of element isolation insulating films 4 and 4'. Sidewall protection film 22 may comprise a material which is wet etched at an etch rate that differs from the etch rates of interelectrode insulating film 7 and element isolation insulating films 4 and 4'. For example, etch selectivity may be configured such that sidewall protection film 22 is etched by a second chemical liquid which etches sidewall protection film 22 with a higher etch rate compared to interelectrode insulating film 7 and element isolation insulating films 4 and 4'.

In case element isolation insulating films 4 and 4' each comprise silicon oxide film, and a portion of interelectrode insulating film 7 comprises a silicon oxide film, for example, sidewall protection film 22 may comprise a silicon nitride film and second chemical liquid may comprise hydrofluoric acid of hot phosphoric acid.

The material of sidewall buffer film 21 may be selected so that material so that stress difference between sidewall buffer film 21 and interelectrode insulating film 7 is smaller than the stress difference between sidewall protection film 22 and interelectrode insulating film 7. For example, when sidewall protection film 22 comprises a silicon nitride film, sidewall buffer film 21 may comprise a silicon oxide film.

Next, as shown in FIGS. 18A to 18F, a portion of element isolation insulating film 4 is removed by wet etching using wet etchant such as a dilute hydrofluoric acid to form air gap AG1 between floating gate electrodes 6 adjacent to one another in word line direction DW. When removing a portion of element isolation insulating film 4, the upper end of air gap AG1 is preferably higher than tunnel insulating film 5 and the lower end of air gap AG1 is preferably lower than tunnel insulating film 5.

Element isolation insulating film 4' of the peripheral circuit region is also exposed to the wet etchant as was the case with element isolation insulating film 4. However, the material used in element isolation insulating film 4' in the peripheral circuit region has a smaller etch rate compared to the material used in element isolation insulating film 4. Thus, the etch amount of element isolation insulating film 4' is significantly small which only amounts to a depth of approximately 10 nm at most. That is, the amount of recessing, i.e. the depth of recess (indicated by RA in FIG. 18F) located in the upper portion of element isolation insulating film 4' is 10 nm or less. In such case, a recess having a depth which is approximately ⅕ or less (20% or less) for example of the thickness of the floating gate electrode 6 is formed above the upper portion of element isolation insulating film 4'. In other words, the amount of recessing of the upper portion of element isolation insulating film 4' is approximately ⅕ or less (20% or less) for example of the thickness of floating gate electrode 6. The recess is shown as "RA" in FIG. 18F. The recess is a distance between an upper surface of the element isolation insulating film 4' contacting interelectrode insulating film 7 and the lowermost upper surface of the element isolation insulating film 4'.

Then, sidewall protection film 22 disposed along the sidewalls of interelectrode insulating film 7 is removed by wet etching or the like. In case both sidewall protection film 22 and cap insulating film 12 comprise a silicon nitride film, cap insulating film 12 is also removed.

Next, as shown in FIGS. 19A to 19F, cover insulating film 10 is formed above control gate electrode 8 so as to extend across control gate electrodes 8 by methods such as plasma CVD to form air gap AG2 between floating gate electrodes 6 adjacent to one another in bit line direction DB. Cover insulating film 10 may comprise plasma TEOS film, plasma $SiH_4$ film, CVD oxide film (silicon oxide film), or the like. When forming cover insulating film 10 above control gate electrode 8, a condition providing poor step coverage may be applied to prevent air gaps AG1 and AG2 from being filled with cover insulating film 10. Because the amount of recessing of the upper portion of element isolation insulating film 4' in the peripheral circuit region is approximately 10 nm or less, cover insulating film 10 formed above element isolation insulating film 4' and control gate electrode 8 exhibit outstanding planarity.

By covering the sidewalls of tunnel insulating film 5 and interelectrode insulating film 7 with sidewall protection film 22 before element isolation insulating film 4 of the air gap AG1 is removed, tunnel insulating film 5 and interelectrode insulating film 7 can be protected even when the desired wet etch selectivity cannot be obtained between tunnel insulating film 5 and interelectrode insulating film 7.

Then, as shown in FIG. 20, silicon nitride film 25 and silicon oxide film 26 are formed in the listed sequence above cover insulating film 10 by methods such as CVD. Thereafter, components such as wires not shown are formed.

In the above described first embodiment, the film qualities of element isolation insulating film 4 filled in trenches 2 of the memory cell region and element isolation insulating film 4' filled in trenches 2' of the peripheral circuit region are differentiated by, for example, by forming element isolation insulating film 4' with a material that exhibits relatively lower wet etch rate as compared to the wet etch rate of the material of element isolation insulating film 4. As a result, the amount of recessing of element isolation insulating film 4' in the peripheral circuit region can be reduced when forming air gap AG1 by removing a portion of element isolation film 4 in the memory cell region. As a result, planarity of element isolation insulating film 4' located in the peripheral circuit region can be improved which contributes in preventing degradation of electrical properties originating from the materials of element isolation insulating films 4 and 4'. Further, there is no need to protect element isolation insulating film 4' in the peripheral circuit region during the formation of air gap AG1. As a result, the manufacturing process flow can be simplified.

Third Embodiment

Figure 21A:
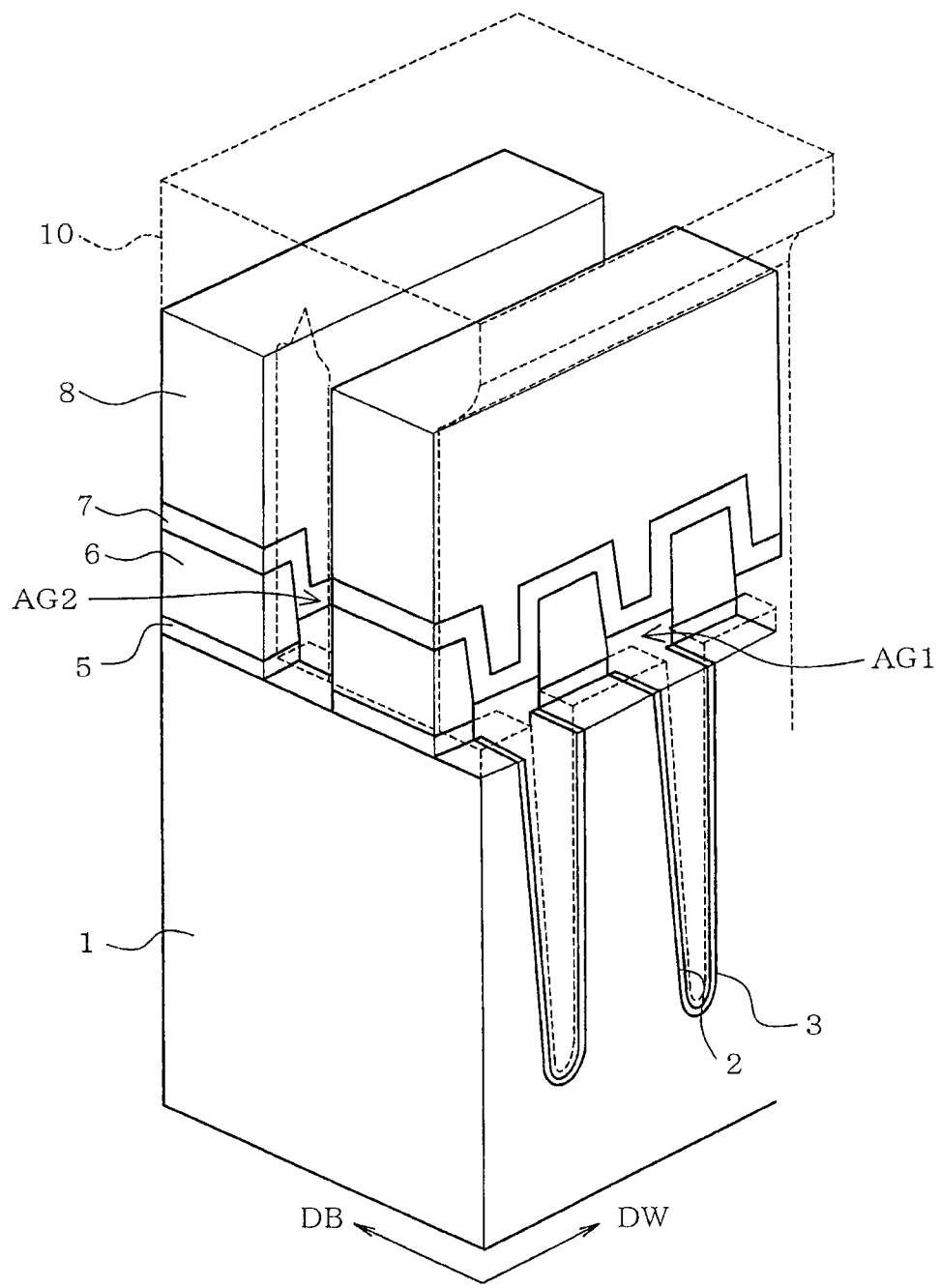
FIG. 21A illustrates a third embodiment and is one example of a perspective view corresponding to FIG. 1.
Figure 21B:
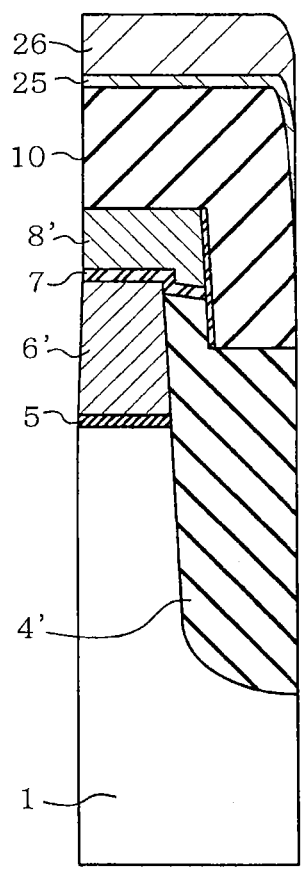
FIG. 21B illustrates the third embodiment and is one example of a cross sectional view corresponding to FIG. 4B.

FIGS. 21A and 21B illustrate a third embodiment. FIG. 21A is one example of a perspective view schematically illustrating the structure of a memory cell of a NAND flash memory device. FIG. 21B is one example of a cross sectional view schematically illustrating the structure of a peripheral circuit transistor of a NAND flash memory device. FIG. 21B corresponds to the cross section taken along line F-F of FIG. 3.

As shown in FIG. 21A, trenches 2 are formed into semiconductor substrate 1 so as to extend in bit line direction DB. Trenches 2 delineate semiconductor substrate 1 into element regions in which memory cells are formed. The sidewalls of trenches 2 are covered by sidewall insulating film 3.

In the element region of semiconductor substrate 1, floating gate electrode 6 is formed in each memory cell via tunnel insulating film 5. Above floating gate electrode 6, control gate electrode 8 is formed in word line direction DW via interelectrode insulating film 7. Above control gate electrode 8, cover insulating film 10 is formed.

Between floating gate electrodes 6 adjacent in word line direction DW, air gaps AG1 is formed so as to extend to sidewall insulating film 3 located at the bottom of trench 2. Air gap AG1 may be formed to extend continuously inside trench 2 so as to run under control gate electrodes 8 of the adjacent memory cells.

In the example shown in FIG. 21A, the element isolation insulating film located in the memory cell region is single layered. Such structure may be described as the state in which element isolation insulating film is completely removed in the first embodiment. Sidewall insulating film 3 and element isolation insulating film 4' of the peripheral circuit region may be made of the same material or different materials.

Cover insulating film 10 is formed to extend across control gate electrodes 8 so as not to completely fill the gaps between floating gate electrodes 6. As a result, air gap AG2 is formed between floating gate electrodes 6 adjacent to one another in bit line direction DB.

By allowing air gap AG1 to extend to the bottom of trench 2, fringe capacitance between control gate electrode 8 and semiconductor substrate 1 can be reduced. As a result, coupling ratio between floating gate electrode 6 and control gate electrode 8 can be improved and thereby reduce the programming voltage.

In forming air gap AG1 that extends to the bottom of trench 2, it is preferable to form the element isolation insulating film inside trench 2 with a material exhibiting higher wet etch rate compared to tunnel insulating film 5, interelectrode insulating film 7, and element isolation insulating film 4' inside trench 2'. For example, when tunnel insulating film 5, interelectrode insulating film 7, and element isolation insulating film 4' comprise a silicon oxide film, element isolation insulating film 4 inside trench 2 may comprise silicon nitride film. In the manufacturing process phase shown in FIGS. 18A to 18F, wet etch is performed using hot phosphoric acid. As a result, element isolation insulating film 4 can be completely removed. The above described arrangement suppresses the etch damage suffered by tunnel insulating film 5, interelectrode insulating film 7, and element isolation insulating film 4' even when the insulating films filled in trench 2 is completely removed.

Further, as was the case in the first embodiment, air gap AG1 is formed in the element isolation insulating film 4 located in the memory cell region but no air gaps are formed in element isolation insulating film 4' located in the peripheral circuit region. In other words, the upper surface of element isolation insulating film 4' is higher in elevation compared to the under surface of the charge storing layer. For example, the upper surface of element isolation insulating film 4' may be substantially level with the upper surface of the charge storing layer. As a result, planarity of element isolation insulating film 4' in the peripheral circuit region can be improved.

Other Embodiments

The following structure may be employed in addition to above described embodiments. In the foregoing embodiments, element isolation insulating film 4' inside trench 2' of the peripheral circuit region is single layered. It is also preferable to use a multi-layered element isolation insulating film 4' obtained by forming a liner film inside trench 2'.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor substrate;
a first element isolation region dividing the semiconductor substrate into first element regions;
memory cells each including a tunnel insulating film, a charge storing layer, an interelectrode insulating film, and a control gate electrode provided one over the other above the first element region;
a second element isolation region dividing the semiconductor substrate into second element regions in a peripheral circuit region located in a periphery of a memory cell array in which the memory cells are disposed; and
a peripheral circuit transistor including a gate insulating film and a gate electrode disposed one over the other above the second element region,
wherein the first element isolation region includes a first element isolation trench, a first element isolation insulating film filled in a bottom portion of the first element isolation trench, and a first gap formed between the first element isolation insulating film and the interelectrode insulating film,
wherein the second element isolation region includes a second element isolation trench and a second element isolation insulating film filled in the second element isolation trench,
wherein the first element isolation insulating film and the second element isolation insulating film have different film properties,
wherein the second element isolation insulating film comprises a single layered film, and
wherein the first element isolation insulating film comprises a first insulating film having a recess and a second insulating film formed in the recess.

2. The device according to claim 1, wherein the first element isolation insulating film comprises a material having a first wet etch rate and the second element isolation insulating film comprises a material having a second wet etch rate different from the first wet etch rate.

3. The device according to claim 1, wherein an amount of recessing of the second element isolation insulating film is equal to or less than 20% of a thickness of the charge storing layer.

4. The device according to claim 1, wherein an upper surface of the first element isolation insulating film is lower than an under surface of the charge storing layer and the upper surface of the second element isolation insulating film is higher than the under surface of the charge storing layer.

5. A semiconductor device, comprising:
a semiconductor substrate;
a first element isolation region dividing the semiconductor substrate into first element regions;
memory cells each including a tunnel insulating film, a charge storing layer, an interelectrode insulating film, and a control gate electrode provided one over the other above the first element region;
a second element isolation region dividing the semiconductor substrate into second element regions in a peripheral circuit region located in a periphery of a memory cell array in which the memory cells are disposed; and
a peripheral circuit transistor including a gate insulating film and a gate electrode disposed one over the other above the second element region,
wherein the first element isolation region includes a first element isolation trench, a first element isolation insulating film filled in a bottom portion of the first element isolation trench, and a first gap formed between the first element isolation insulating film and the interelectrode insulating film,
wherein the second element isolation region includes a second element isolation trench and a second element isolation insulating film filled in the second element isolation trench,
wherein the first element isolation insulating film and the second element isolation insulating film have different film properties, and
wherein the first element isolation insulating film comprises a coating type oxide film and the second element isolation film comprises a chemical vapor deposition oxide film.

6. The device according to claim 5, wherein an upper end of the first gap is higher than the tunnel insulating film and the lower end of the first gap is lower than the tunnel insulating film.

7. The device according to claim 5, further comprising a sidewall insulating film that covers sidewalls of the first element isolation insulating trench and that has a recess, wherein the first element isolation insulating film is formed in the recess of the sidewall insulating film.

8. The device according to claim 7, wherein the first element isolation insulating film comprises a material having a first wet etch rate and the sidewall insulating film comprises a material having a third wet etch rate different from the first wet etch rate.

9. The device according to claim 5, wherein the gate electrode of the peripheral circuit transistor includes a lower gate electrode and an upper gate electrode, wherein an upper surface of the second element isolation insulating film is substantially level with an upper surface of the lower gate electrode.

10. A semiconductor device according, comprising:
a semiconductor substrate;
a first element isolation region dividing the semiconductor substrate into first element regions;
memory cells each including a tunnel insulating film, a charge storing layer, an interelectrode insulating film, and a control gate electrode provided one over the other above the first element region;
a second element isolation region dividing the semiconductor substrate into second element regions in a peripheral circuit region located in a periphery of a memory cell array in which the memory cells are disposed; and
a peripheral circuit transistor including a gate insulating film and a gate electrode disposed one over the other above the second element region,
wherein the first element isolation region includes a first element isolation trench, a first element isolation insulating film filled in a bottom portion of the first element isolation trench, and a first gap formed between the first element isolation insulating film and the interelectrode insulating film,
wherein the second element isolation region includes a second element isolation trench and a second element isolation insulating film filled in the second element isolation trench,
wherein the first element isolation insulating film and the second element isolation insulating film have different film properties,
wherein a second gap is formed between the charge storing layers adjacent to one another in a bit line direction of the memory cells, and
wherein the second gap is vertically asymmetrical and an upper end of the second gap is pointed.

11. The device according to claim 10, further comprising a sidewall insulating film covering sidewalls of the first element isolation trench.

12. The device according to claim 11, wherein the first element isolation insulating film comprises a silicon nitride film and the second element isolation insulating film comprises a silicon oxide film.

\* \* \* \* \*